(12) United States Patent
Ko

(10) Patent No.: US 10,512,185 B2
(45) Date of Patent: Dec. 17, 2019

(54) STRUCTURE FOR COMBINING CABLE AND CASING

(71) Applicants: VISION X ASIA CO., LTD., Hwaseong-si (KR); In Hong Ko, Seoul (KR)

(72) Inventor: In Hong Ko, Seoul (KR)

(73) Assignees: VISION X ASIA CO., LTD., Gyeonggi-Do (KR); In Hong Ko, Seoul (KR)

( * ) Notice: Subject to any disclaimer, the term of this patent is extended or adjusted under 35 U.S.C. 154(b) by 0 days.

(21) Appl. No.: 16/169,270

(22) Filed: Oct. 24, 2018

(65) Prior Publication Data

US 2019/0174646 A1 Jun. 6, 2019

(30) Foreign Application Priority Data

Dec. 5, 2017 (KR) ......................... 10-2017-0166139

(51) Int. Cl.
*H05K 5/06* (2006.01)
*H05K 5/00* (2006.01)
*H05K 5/02* (2006.01)

(52) U.S. Cl.
CPC .......... *H05K 5/069* (2013.01); *H05K 5/0008* (2013.01); *H05K 5/0221* (2013.01); *H05K 5/0247* (2013.01); *H05K 5/065* (2013.01)

(58) Field of Classification Search
CPC .... H05K 5/069; H05K 5/0008; H05K 5/0221; H05K 5/0247; H05K 5/065; H02G 3/083; H02G 3/088; H02G 15/007; H02G 15/013
See application file for complete search history.

(56) References Cited

U.S. PATENT DOCUMENTS 6,621,005 B1 * 9/2003 Lovec ................ A61B 1/00114
174/74 R
8,791,374 B1 * 7/2014 Smith .................. H02G 3/0616
174/530

(Continued)

FOREIGN PATENT DOCUMENTS

CN 204677574 9/2015
EP 2615894 7/2013

(Continued)

OTHER PUBLICATIONS

European Search Report—European Application No. 18203728, dated Mar. 19, 2019, citing KR 2010 0089458, US 2006/003629 and EP 2 615 894.

*Primary Examiner* — Binh B Tran
*Assistant Examiner* — Douglas R Burtner
(74) *Attorney, Agent, or Firm* — Cantor Colburn LLP

(57) ABSTRACT

Provided is a structure for combining a cable and a casing and, more particularly, to a structure in which performance of assembling the cable and casing is excellent, waterproof performance is enhanced, and a risk that the cable is separate from the casing is prevented. The structure includes: a screw groove provided on a front side of an inner surface of a through hole of the casing; locking notches continuously provided on a rear side of the inner surface of the through hole; a screw protrusion having the cable penetrating the through hole and screw-engaged with the screw groove; and a locking protrusion provided on the cable, and having an inclined surface moving over the locking notches in a forward direction and a locking surface preventing the locking protrusion from moving in a reverse direction by being engaged with the locking notches.

6 Claims, 5 Drawing Sheets

(56) References Cited

U.S. PATENT DOCUMENTS

| | | | |
|---|---|---|---|
| 9,966,749 B1* | 5/2018 | Langenwalter | H02G 3/16 |
| 2006/0003629 A1 | 1/2006 | Murphy et al. | |
| 2011/0226526 A1* | 9/2011 | Chu | H02G 3/088 |
| | | | 174/659 |
| 2013/0153290 A1* | 6/2013 | Schlegel | H02G 3/0658 |
| | | | 174/653 |
| 2013/0277105 A1* | 10/2013 | Spilker | H02G 3/0616 |
| | | | 174/653 |
| 2013/0288515 A1* | 10/2013 | Riepe | H02G 3/0641 |
| | | | 439/471 |
| 2016/0126715 A1* | 5/2016 | Bigeh | H02G 15/013 |
| | | | 439/676 |
| 2016/0201863 A1* | 7/2016 | Kwast | F21S 8/06 |
| | | | 362/404 |
| 2017/0117693 A1* | 4/2017 | Kohonen | H02G 3/083 |
| 2018/0269674 A1* | 9/2018 | Dong | H02G 3/0658 |
| 2019/0097403 A1* | 3/2019 | Rana | H02G 3/0616 |

FOREIGN PATENT DOCUMENTS

| | | |
|---|---|---|
| KR | 200172689 | 3/2000 |
| KR | 100557494 | 3/2006 |
| KR | 20100089458 | 8/2010 |
| KR | 20110089560 | 8/2011 |

* cited by examiner

STRUCTURE FOR COMBINING CABLE AND CASING

CROSS REFERENCE TO RELATED APPLICATION

The present application claims priority to Korean Patent Application No. 10-2017-0166139, filed Dec. 5, 2017, the entire contents of which is incorporated herein for all purposes by this reference.

BACKGROUND OF THE INVENTION

Field of the Invention

The present invention relates to a structure for combining a cable and a casing and, more particularly, to a structure in which assembling performance is improved, waterproof performance is enhanced, and a risk that the cable is separated from the casing is prevented.

Description of the Related Art

Generally, the cable is used as a transmission medium for supplying power or transmitting a signal.

The cable is inserted into a casing, and connected to a printed circuit board (PCB), a connector, a terminal provided inside the casing for supplying power or transmitting a signal.

A connection between the cable with the PCB, the connector, and the terminal is weak. Therefore, when external force acts on the cable, there is a risk that the cable will be separated from the PCB, the connector, and the terminal.

Even if the external force acts, when the cable is combined with the casing, the cable is prevented from being separated from the PCB, the connector, and the terminal by the external force transmitted.

FIG. 1 shows a structure for combining a cable and a casing disclosed in Korean Patent Application Publication NO. 10-2011-0089560.

Referring to FIG. 1, a through hole of the casing 10 through which the cable 40 is penetrated has a coupler 51 having a thread protruding outward on an outer surface, a gland 54 screw-engaged with the coupler 51 is inserted into an external circumference of the cable 40 to be possible to move along the cable 40, an end portion of the cable 40 has a locking portion 53 that is expanded so as to be locked with inside of the gland 54.

In the structure for combining the cable and the casing, it is difficult to tighten the glands 54 with the coupler 51. Since the gland 54 must be manufactured separately and inserted into the external circumference of the cable 40, a manufacturing cost rises and productivity decreases. When external impact continues, screw-combination of the gland 54 and the coupler 51 may be separated slowly. In addition, since the coupler 51 has a structure protruding outward of the casing 10, it may be damaged by an external impact.

FIG. 2 shows a structure for combining a cable and a casing disclosed in Korean Utility Model Registration No. 20-017269.

Referring to FIG. 2, the structure 5 of the casing 10 through which the cable 15 is penetrated has a locking hole 16, and the cable 15 has an injection molding 17 seated in the locking hole 16 and locked on inner and outer surfaces thereof.

In the structure for combining the cable and the casing, the cable 15 and the casing are easily combined by inserting the injection molding of the cable 15 in the locking hole 16 of the structure 5 of the casing 10 to seat thereon. However, since bonding force is weak, the injection molding 17 may be separated from the locking hole 16 due to the external impact, and since a gap between the injection molding 17 and the locking hole 16 is large, waterproof and dustproof characteristics thereof are weak.

SUMMARY OF THE INVENTION

Accordingly, the present invention has been made keeping in mind the above problems occurring in the related art, and the present invention is intended to propose a structure for combining a cable and a casing, wherein the structure in which the cable is easily and quickly combined with the casing to provide an excellent assembling performance, and the cable is closely contacted to the casing to increase waterproof performance is provided, whereby a risk that the cable is separated from the casing by an impact is prevented so as to have a high stability of combining thereof.

In order to achieve the above object, according to one aspect of the present invention, there is provided a structure for combining the cable and the casing, the structure including: a screw groove provided on a front side of an inner surface of a through hole of the casing; locking notches continuously provided on a rear side of the inner surface of the through hole; a screw protrusion having the cable penetrating the through hole and screw-engaged with the screw groove; and a locking protrusion provided on the cable, and having an inclined surface configured to allow the locking protrusion to move over the locking notches in a forward direction and a locking surface configured to allow the locking protrusion to prevent movement thereof in a reverse direction by being engaged with the locking notches.

In addition, a boundary between the locking notches and the screw groove of the casing has a stepped surface, a boundary between the locking protrusion and the screw protrusion of the cable has a contact surface that is in contact with the stepped surface, and the cable further has a molding portion integrally formed with a sheath of the cable, with both the screw protrusion and the locking protrusion being provided on the molding portion, in which a polygonal tightening portion is included in the molding portion by being located at a rear side of the locking protrusion.

In the structure for combining the cable and the casing according to the present invention, the cable and the casing are easily assembled by only rotating the cable in state of being inserted in a through hole of the casing.

Further, the cable and the casing are screw-combined at a front side to not allow non-rotational linear movement, and they are lock-combined at a rear side to be allowed for forward rotation but not reverse rotation, so that risk of the cable is separated from the casing is prevented.

Further, since the cable is allowed to move only forward but not the reverse rotation, the contact surface of the cable closely contacts with the stepped surface of the casing, thereby ensuring excellent waterproof and dustproof characteristics.

Further, since the screw protrusion and the locking protrusion of the cable are formed by a molding technique to integrally form with the sheath of the cable, the present invention is inexpensive in manufacturing cost and high in productivity, and is useful for industrial development.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION OF THE INVENTION

Figure 1:
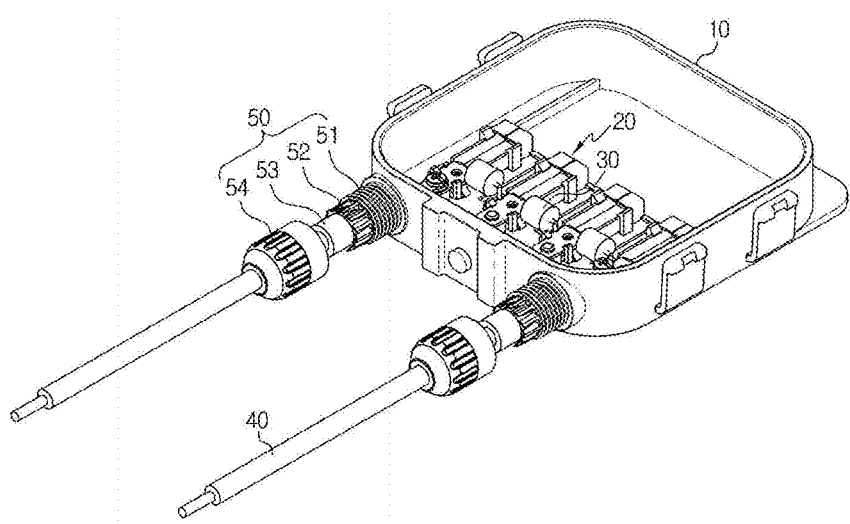
FIG. 1 is a prospective view showing a structure for combining a cable and a casing according to a related art.

Hereinbelow, a structure for combining a cable and a casing according to the present invention will be described in detail with reference to the accompanying drawings.

The present invention will now be described in detail based on aspects (or embodiments). The present invention may, however, be embodied in many different forms and should not be construed as being limited to only the embodiments set forth herein, but should be construed as covering modifications, equivalents or alternatives falling within ideas and technical scopes of the present invention.

In the drawings, like reference numerals, particularly, reference numerals having the same last two digits or the same last two digits and letters refer to like elements having like functions throughout, and unless the context clearly indicates otherwise, elements referred to by reference numerals of the drawings should be understood based on this standard.

Also, for convenience of understanding of the elements, in the drawings, sizes or thicknesses may be exaggerated to be large (or thick), may be expressed to be small (or thin) or may be simplified for clarity of illustration, but due to this, the protective scope of the present invention should not be interpreted narrowly.

The terminology used herein is for the purpose of describing particular aspects (or embodiments) only and is not intended to be limiting of the present invention. As used herein, the singular forms are intended to include the plural forms as well, unless the context clearly indicates otherwise.

It will be further understood that the terms "comprises", "comprising", "includes", and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms including technical and scientific terms used herein have the same meaning as commonly understood by one of ordinary skill in the art to which the present invention belongs. It will be further understood that terms used herein should be interpreted as having a meaning that is consistent with their meaning in the context of this specification and the relevant art and will not be interpreted in an idealized or overly formal sense unless expressly so defined herein.

Figure 2:
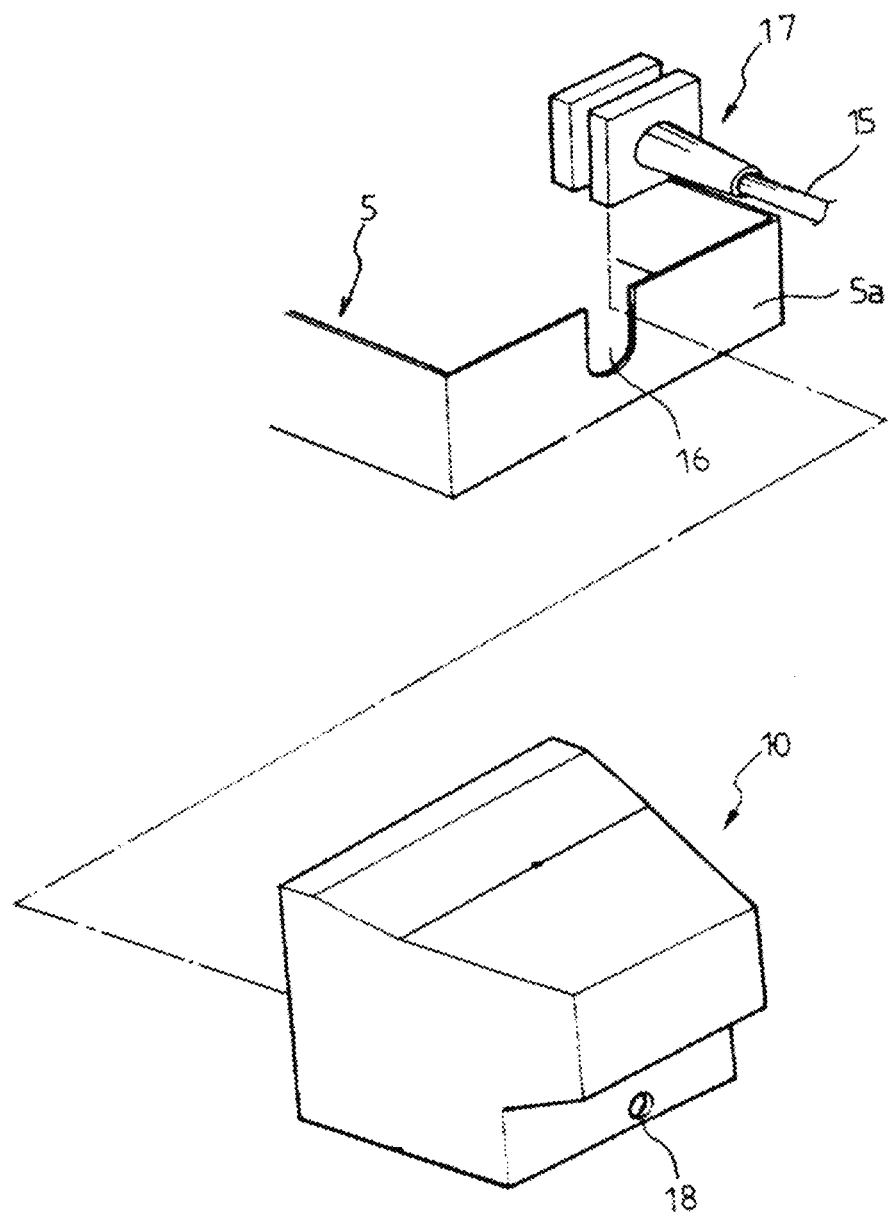
FIG. 2 is a prospective view showing a structure for combining a cable and a casing according to another related art.

Before describing the present invention in more detail, reference numerals used for elements of the present invention in the following description are not related to the reference numerals used for the related art of FIGS. 1 and 2.

Based on the direction in which the cable is inserted into the casing, the front of the direction is defined as a front side and the rear of the direction is defined as a rear side.

Figure 3:
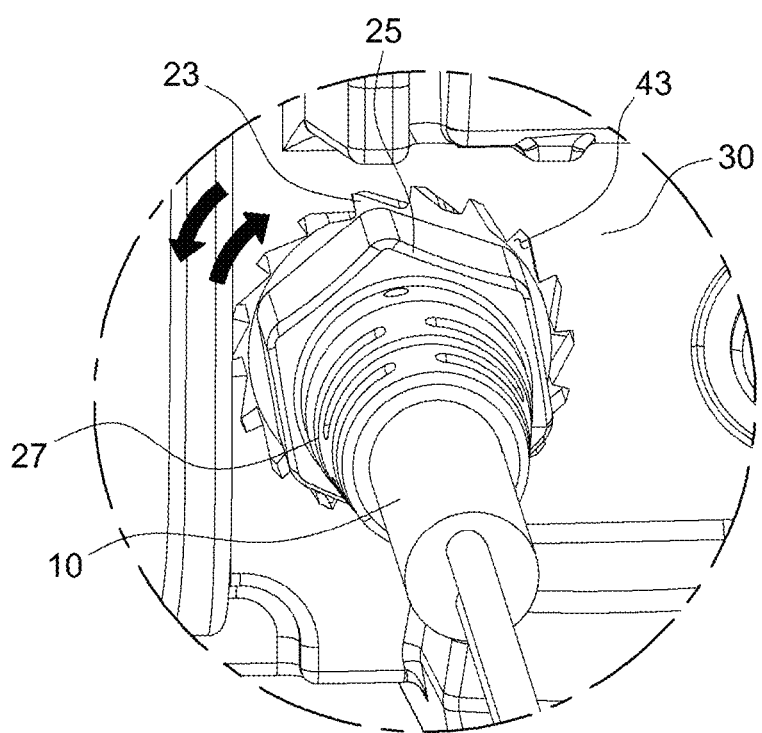
FIG. 3 is a prospective view showing a cable and a casing having a combining structure according to the present invention.
Figure 4:
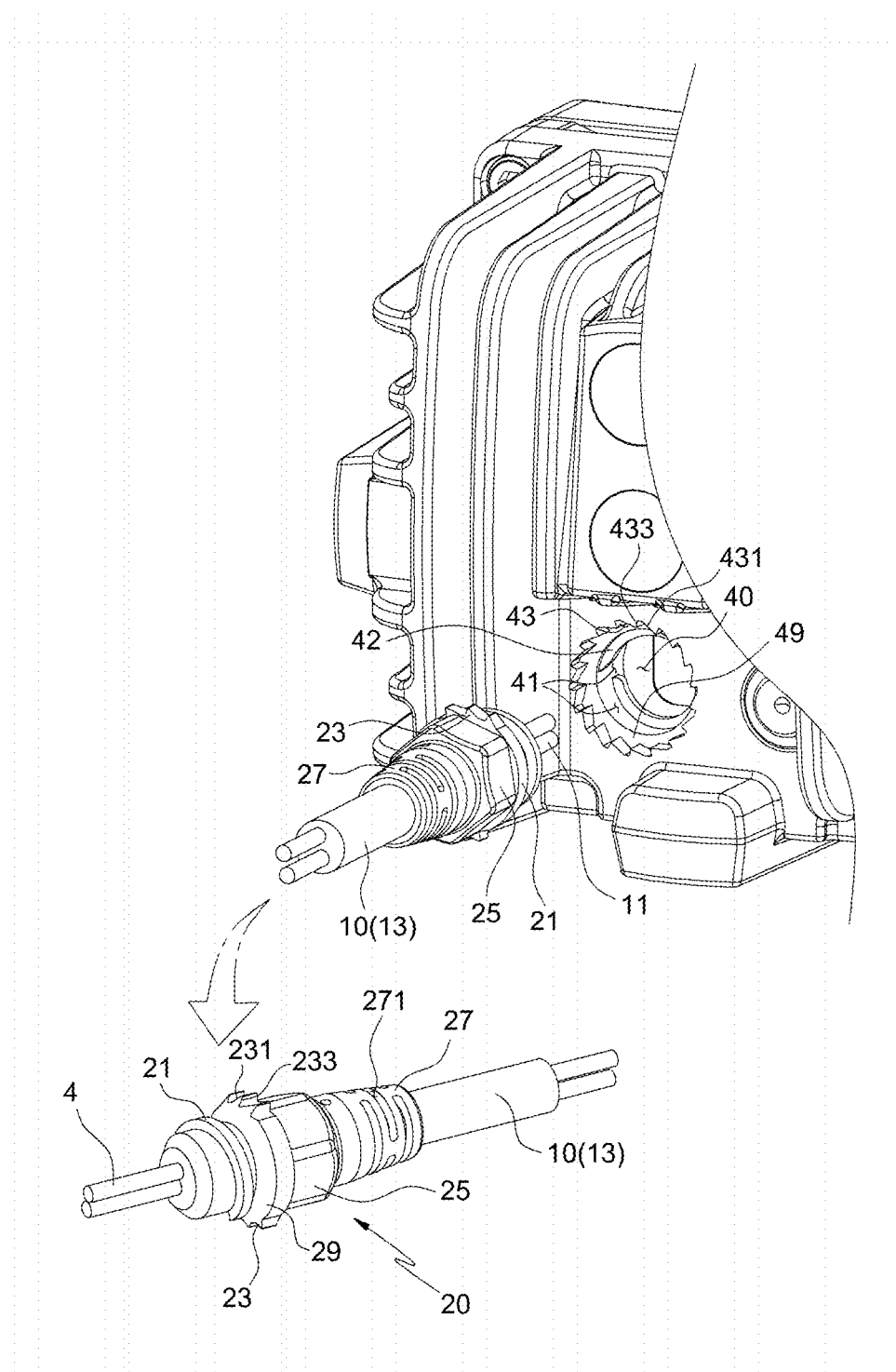
FIG. 4 is an exploded perspective view of FIG. 3.
Figure 5:
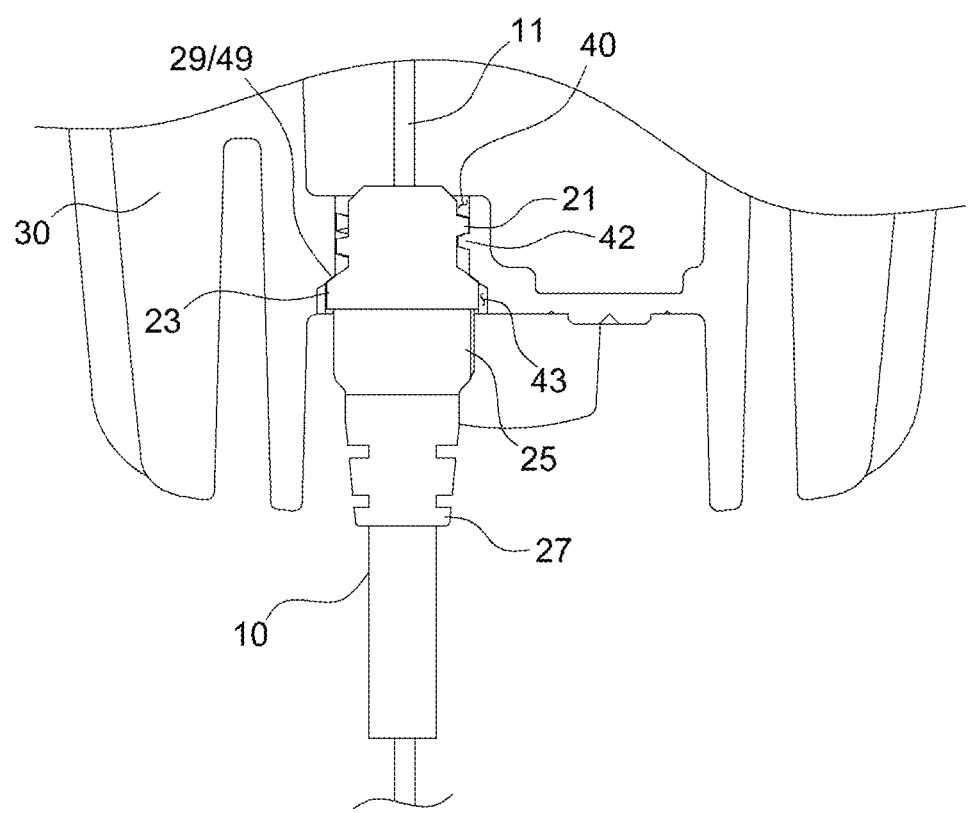
FIG. 5 is a sectional view of FIG. 3.

As shown in FIGS. 3 to 5, the structure for combining the cable 10 and the casing 30 according to the present invention is composed of a screw protrusion 21, a locking protrusion 23, and a tightening portion 25 that are provided on a molding portion 20 of the cable 10. The structure further includes a screw groove 41 and locking notches 43 that are provided on a through hole 40 of the casing 30.

The cable 10 is composed of a transmission medium 11 for supplying power or transmitting a signal, and a sheath 13 for surrounding the transmission medium 11 for protection thereof. A conducting wire or an optical fiber is used for the transmission medium 11.

The molding portion 20 of the cable 10 is integrally combined with the sheath 13 of the cable 10 by a molding technique. The molding portion 20 may be formed by insert-injection molding to the cable 10 of a finished product, and when forming the sheath 13 surrounding the transmission medium 11 of the cable 10, the molding portion 20 may also be formed together.

The screw protrusion 21 is formed on a front outer circumference of the molding portion 20, a plurality of locking protrusions 23 is formed on a rear outer circumference thereof, the tightening portion 25 is formed on a rear outer circumference of the locking protrusion 23, and an external-force disperser 27 is formed on the tightening portion 25.

The screw protrusion 21 has a structure protruding in a helical direction from the outer circumference of the molding portion 20, and is screw-engaged with the screw groove 41 of the casing 30.

The locking protrusion 23 has an inclined surface 231 that is connected to the outer circumference of the molding portion 20 at a gentle angle, and a locking surface 233 that is connected to the outer circumference of the molding portion 20 at a steep angle close to a right angle.

The plurality of locking protrusions 23 is formed on the outer circumference of the molding portion 20 and is arranged in all directions, and is engaged with the locking notches 43 of the casing 30.

When the locking protrusion 23 rotates in a forward direction, the inclined surface 231 of the locking protrusion 23 moves over the locking notches 43 of the casing 30, and when the locking protrusion 23 rotates in a reverse direction, the locking surface 233 of the locking protrusion 23 prevents rotation thereof in the reverse direction by being engaged with the locking notches 43.

In the molding portion 20, a diameter of a portion where the locking protrusion 23 is formed is longer than a diameter of the screw protrusion 21.

Thus, the boundary between the locking protrusion 23 and the screw protrusion 21, more specifically, the front end side of the locking protrusion 23, has a contact surface 29.

The contact surface 29 is in contact with a stepped surface 49 of the casing 30.

The tightening portion 25 is formed as a polygonal shape on the outer circumference of the molding portion 20. Thus, a worker can rotate the molding portion 20 while holding the tightening portion 25 with a hand, thereby combining the molding portion 20 to the casing 30. Also, the worker can use a tightening device such as a spanner to rotate the tightening portion 25 and combine the molding portion 20 to the casing 30.

The external force disperser 27 is formed on a last end side of the molding portion 20. The diameter of the external-force disperser 27 gradually decreases with going backward. The external force disperser 27 has a plurality of cutting grooves 271 which is formed in the outer circumferential direction to expose the sheath 13 of the cable 10.

When the external force acts on the cable 10, the external force disperser 27 is bent with the cable 10 in a direction in which the external force acts, thereby dispersing the external force.

The casing 30 has the through hole 40 so that the cable 10 is inserted in the through hole to be placed in the inside of the casing.

The screw groove 41 is provided on a front side of an inner surface where the through hole 40 is provided, and the locking notches 43 are continuously provided on a rear side of the inner surface.

The screw groove 41 is formed such that a thread 42 is protruded in a helical direction on the front side of the inner surface of the through hole 40.

The screw groove 41 is screw-engaged with the screw protrusion 21 of the cable 10.

The locking notches 43 are provided continuously on the rear side of the inner surface of the through hole 40.

An inner wall composed of the locking notches 43 includes a gradually inclined portion 431 which is gently inclined corresponding to a shape of the locking protrusion 23 of the cable 10, and a steep portion 433 which is steeply inclined.

The locking protrusion 23 of the cable 10 is seated in the locking notches 43 of the casing 30. When the cable 10 rotates in a forward direction, the inclined surface 231 of the cable 10 having a gently inclined angle is contacted with the gradually inclined portion 431 of the casing 30 to allow the cable 10 to rotate in the forward direction. However, when the cable 10 rotates in a reverse direction, the locking surface 233 of the cable 10 is contacted with the steep portion 433 of the casing 30 to prevent the cable 10 from rotating in the reverse direction.

The boundary between the screw groove 41 and the locking notches 43 of the through hole 40 of the casing 30, more specifically, the bottom of a front end side of the locking notches 43, has a stepped surface 49.

The stepped surface 49 of the casing 30 is contacted with and stops the contact surface 29 of the cable 10 and prevents the molding portion 20 of the cable 10 from further entering the casing 30.

In addition, when the molding portion 20 is forcibly rotated in a state in which the stepped surface 49 and the contact surface 29 are in contact, the stepped surface 49 and the contact surface 29 is strongly contacted to each other by a force that the molding portion 20 moves forward by the screw protrusion 21. Thus, a gap is sealed.

Referring to the drawings, eighteen locking notches 43 are continuously provided. Thus, when the molding portion 20 rotates in a forward direction and the locking protrusion 23 moves over one locking notch 43, the molding portion 20 rotates at 20 degree angles. Here, the molding portion 20 is designed to move 0.2 mm forward by the screw protrusion 21.

In the above description of the present invention, although the structure for combining the cable and the casing having a predetermined shape and structure according to the present invention have been disclosed with reference to the accompanying drawings, the present invention may be variously modified and edited by those skilled in the art without departing from the scope and spirit of the invention as disclosed in the accompanying claims.

What is claimed is:

1. A structure for combining a cable and a casing, the structure comprising:
   a screw groove provided on a front side of an inner surface of a through hole of the casing;
   locking notches continuously provided on a rear side of the inner surface of the through hole;
   a screw protrusion having the cable penetrating the through hole and screw-engaged with the screw groove; and
   a locking protrusion provided on the cable, and having an inclined surface configured to allow the locking protrusion to move over the locking notches in a forward direction and a locking surface configured to prevent the locking protrusion from moving in a reverse direction by being engaged with the locking notches.

2. The structure of claim 1, wherein a boundary between the locking notches and the screw groove has a stepped surface and a boundary between the locking protrusion and the screw protrusion of the cable has a contact surface that is in contact with the stepped surface.

3. The structure of claim 1, further comprising:
   a molding portion integrally formed with a sheath of the cable, with both the screw protrusion and the locking protrusion being provided on the molding portion.

4. The structure of claim 2, further comprising:
   a molding portion integrally formed with a sheath of the cable, with both the screw protrusion and the locking protrusion being provided on the molding portion.

5. The structure of claim 3, wherein the molding portion has a polygonal tightening portion at a rear side of the locking protrusion.

6. The structure of claim 4, wherein the molding portion has a polygonal tightening portion at a rear side of the locking protrusion.

* * * * *